United States Patent [19]

Matsuda et al.

[11] Patent Number: 4,489,241
[45] Date of Patent: Dec. 18, 1984

[54] EXPOSURE METHOD WITH ELECTRON BEAM EXPOSURE APPARATUS

[75] Inventors: Tadahito Matsuda, Iruma; Tsuneo Okubo, Hachioji; Susumu Ozasa, Kashiwa; Norio Saitou, Iruma; Haruo Yoda, Tokyo, all of Japan

[73] Assignees: Hitachi, Ltd.; Nippon Telegraph & Telephone Public Corporation, both of Tokyo, Japan

[21] Appl. No.: 386,579

[22] Filed: Jun. 9, 1982

[30] Foreign Application Priority Data

Jun. 10, 1981 [JP] Japan ................................. 56-88185

[51] Int. Cl.³ ............................................ H01J 37/317
[52] U.S. Cl. .................................. 250/491.1; 250/492.2
[58] Field of Search ........................... 250/491.1, 492.2

[56] References Cited

U.S. PATENT DOCUMENTS 4,322,626 3/1982 Kawashima ..................... 250/492.2

Primary Examiner—Alfred E. Smith
Assistant Examiner—Jack I. Berman
Attorney, Agent, or Firm—Antonelli, Terry & Wands

[57] ABSTRACT

An exposure method with an electron beam exposure apparatus in which an electron beam is emitted onto a substrate such as a silicon wafer on which an electron-beam sensitive resist is coated, thereby directly forming or writing patterns. A substrate having thereon a number of chips are divided into blocks, which each contain a plurality of chips. Marks are provided on each of the blocks, the positions of the marks are detected and the writing exposure positions of the chips within each block are modified on the basis of the detection results. According to this invention, efficient writing exposure can be made with high accuracy.

13 Claims, 5 Drawing Figures

EXPOSURE METHOD WITH ELECTRON BEAM EXPOSURE APPARATUS

This invention relates to an exposure method with an electron beam exposure apparatus in which an electron beam is emitted onto a substrate such as a silicon wafer on which an electron-beam sensitive resist is coated, thereby directly forming or writing an exposure pattern.

In the manufacture of high-density integrated semiconductor devices, a direct writing exposure method using an electron beam is used in order to miniaturize such devices to a great extent and improve the characteristics thereof. In this case, it is necessary to direct the electron beam so that it is accurately positioned with respect to a pattern already defined on a semiconductor wafer.

Thus, there has been proposed a method in which marks for alignment are provided on the periphery or inside of the semiconductor wafer, the periphery of the marks is scanned with the electron beam, the resulting reflected electrons therefrom are detected thereby to detect the mark positions, and the writing exposure positions are corrected on the basis of the detection results.

This method, however, has a drawback that when the semiconductor wafer has a large distortion, high writing exposure accuracy cannot be achieved by means of marks for alignment provided on the periphery of the semiconductor wafer. Moreover, when alignment is made using a mark put on each chip within the semiconductor wafer, there is no problem in the writing exposure accuracy, but the time for the writing exposure is increased because detection of mark positions is required for each chip. Furthermore, in that case, since exposure must be completed for each chip, it is necessary to store in a memory the data for exposure of all patterns within each chip. Accordingly, since a very large memory capacity is needed for higher-density integration, the exposure apparatus becomes large-sized and costly.

Thus, it is an object of this invention to provide a pattern writing exposure method in which writing exposure time is remarkably reduced.

It is another object of this invention to provide a pattern writing exposure method in which the memory capacity necessary for exposure is remarkably reduced for small-sized and inexpensive writing exposure apparatus.

According to a main aspect of this invention, there is provided a pattern exposure method comprising steps of dividing a substrate surface of a semiconductor wafter into blocks each including a plurality of chips, providing marks on each block, detecting mark positions for alignment for each block unit and performing pattern writing exposure.

According to another aspect of this invention, there is provided a pattern writing exposure method in which each chip is further divided into a plurality of fields and the same fields of the chips in each block are exposed in sequence.

According to still another aspect of this invention, there is provided a pattern exposure method in which the heights of the marks within each block are detected and the detection results are used to modify the exposure reference surface of the substrate.

In order that the invention may be readily carried into effect, an embodiment thereof will now be described, by way of example, with reference to the accompanying drawings, in which.

An embodiment of this invention will hereinafter be described in detail.

Figure 1:
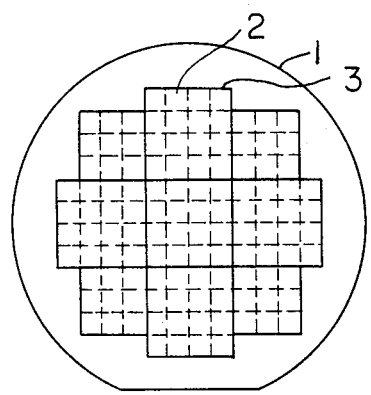
FIG. 1 shows a wafer having a plurality of chips divided into blocks in accordance with the present invention.

FIG. 1 shows the chip arrangement on a semiconductor wafer according to the method of this invention. A semiconductor wafer 1 has 116 chips 2 arranged in 9 block regions 3. Each block region contains 9 or 16 chips 2.

Figure 2:
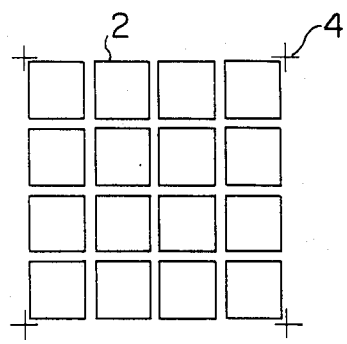
FIG. 2 shows a single block from FIG. 1 containing 16 chips along with markings for the block in accordance with one aspect of the present invention.

According to the experiments by the inventors of this invention, a normal wafer was used, and a mark was provided on each vertex of each square of 20×20 mm on the wafer. Then, when pattern writing exposure was performed with the writing exposure position corrected on the basis of the information resulting from detecting the position, the precision of writing exposure obtained was within 0.1 $\mu$m. On the other hand, it was found that when the square size was significantly larger, the writing exposure precision was reduced to a great extent. Since the chip size is usually about 5 mm×5 mm, a square of 20 mm×20 mm contains 16 chips. Thus, when the wafer 1 is divided into blocks 3 each containing 16 chips as shown in FIG. 1 and a mark 4 is put on each corner of each block as shown in FIG. 2, relatively good precision can be achieved as described above.

The mark position is detected for each block unit produced by such division of the wafer, and alignment is made on the basis of the result of the mark detection, thereby relatively high writing exposure precision being achieved with no practical problem.

As compared with the conventional method in which the mark position is detected for each chip, 107 sets of mark positions can be omitted in the example of FIG. 1 and if it takes 3 seconds for one set of mark positions to be detected, a total of 321 seconds can be saved in the writing exposure time.

Figure 3:
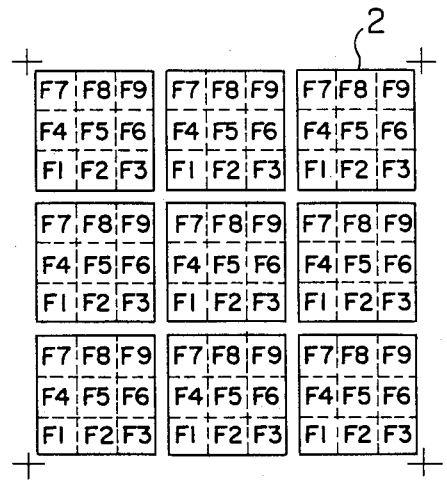
FIG. 3 shows 9 chips in another block from FIG. 1 with each chip divided into a number of fields in accordance with another aspect of the present invention.

FIG. 3 is an explanatory diagram useful for explaining the second feature of this invention. Each chip 2 in each block produced by division as described above is divided into a plurality of (in the illustrated example, nine) exposure fields F1 to F9, and the same fields, for example, fields F1 of the chips in each block are continuously exposed for pattern writing. After the writing exposure of the fields F1, the next fields F2 are similarly exposed successively.

In the conventional exposure method, all the fields within a chip are sequentially exposed, then the fields in the next chip are similarly done, and so on. In this case, since from the viewpoint of the writing exposure speed, there is a need to store in a memory the necessary data for writing exposure of all the fields within each chip, the memory capacity becomes very great. According to the example of this invention as described before, a double-side buffer memory which will be described later can be used and therefore the memory capacity can be reduced to a great extent.

Figure 4:
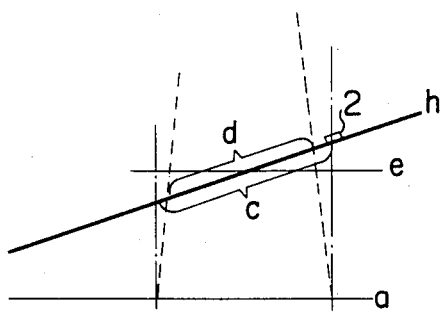
FIG. 4 is a diagram of the ideal reference plane and the actual reference plane for explaining another aspect of the present invention.

FIG. 4 is an explanatory diagram useful for explaining the third feature of this invention. This diagram shows the condition of the writing exposure plane.

In FIG. 4, an actual writing exposure plane h is different from an ideal writing exposure reference plane a due to wafer distortion. Therefore, with the electron beam represented by broken lines, an actual writing exposure region d is different from a writing exposure region c corresponding to the writing exposure reference plane a, that is, error is caused around the writing exposure region, thereby distorting the exposure pattern.

Thus, in the embodiment of this invention, the writing exposure reference plane a is modified into the actual writing exposure plane h or an average horizontal plane e of the writing exposure region. To this end, the height of the mark portion at each corner of a block is measured, and this value is used to change the focus current and deflection current for controlling the electron beam.

Thus, by modifying the writing exposure reference surface, the writing exposure precision can be remarkably improved. Even if the wafer is distorted to a great extent, a sufficiently high writing exposure precision can be achieved by detection of the marks of each block.

Figure 5:
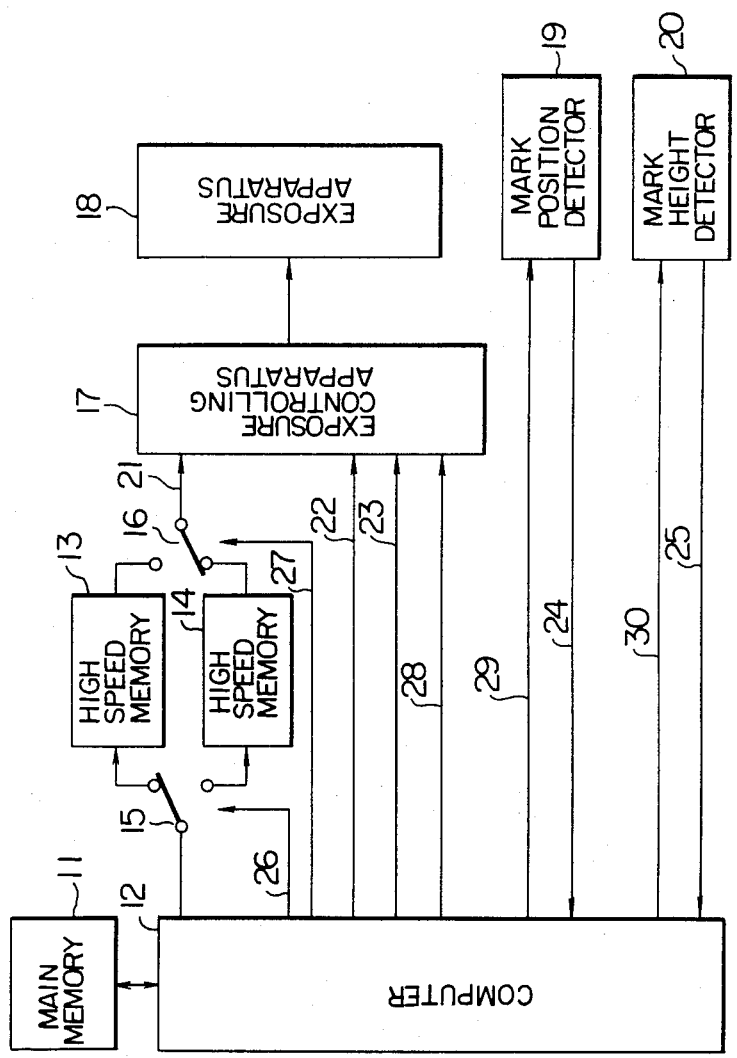
FIG. 5 is a block diagram of an embodiment of the apparatus for embodying a pattern writing exposure method according to this invention.

FIG. 5 shows the arrangement of one embodiment of the apparatus for embodying the writing exposure method according to this invention.

Referring to FIG. 5, there are shown a large capacity memory 11 such as a magnetic disk unit, a computer 12, high-speed memories 13 and 14 formed by semiconductor memory elements or the like, changeover switches 15 and 16, an exposure control apparatus 17, an exposure apparatus 18, a mark detector 19, a mark height detector 20, a signal line 21 over which data of a pattern to be drawn or written is transmitted, a signal line 22 over which is sent a signal for moving a sample holder on which a wafer is placed, a signal line 23 over which a modifying data for the writing exposure reference surface is transmitted, a signal line 25 over which a mark-height detected data is sent, signal lines 26 and 27 over which switching signals are transmitted to the switches 15 and 16, and signal lines 28 to 30 over which control signals are transmitted.

In this arrangement, the large capacity memory 11 has stored therein arrangement data and all pattern data showing the positional relation among blocks, chips and fields, and a necessary part of the data in the memory 11 is sequentially read from the memory 11 and supplied to the computer 12 by a command from the computer 12.

The computer 12, in order to detect a mark position in advance, first supplies a signal for permitting a wafer mounting sample holder to move, over the signal line 22 to the exposure control apparatus 17, by which the sample holder is moved to bring a mark of a desired block of the wafer to the center of the region to be scanned. At the same time, the computer 12 sends control signals over the signal lines 28 and 29 to the exposure control apparatus 18 and the mark detector 19, respectively. Consequently, the exposure control apparatus 17 controls the electron beam from the exposure apparatus 18 to scan the mark portion of the block in one direction. The mark detector 19 detects the reflected electrons from the mark portion which the electron beam is scanning, and thus detects the position of the mark from the detected signal. The detection results are fed via the signal line 24 to the computer 12. The mark position can easily be detected by, for example, the apparatus shown in Japanese patent application Laid-open No. 105382/75.

In order to detect the height of a mark for a desired block of the wafer in addition to the mark position detection, the computer 12 supplies a control signal via the signal line 30 to the height detector 20, in which, for example, the apparatus shown in Japanese patent application Laid-open No. 57842/77 is used to emit a light beam to the mark portion and detect the height of the mark portion from the reflected light therefrom. The result of detection is fed via the signal line 25 to the computer 12.

The computer 12 controls the above apparatus to repeat the same operation as described above for the purpose of detecting the positions and height of the marks at the four corners of the desired block, and receives the results of detection.

When the mark position and height detection have been completed in this way, the computer 12 calculates the actual exposure plane of a block of the wafer from the height signal from the height detector 20 and supplies a control signal for the focus correction lens of the exposure apparatus 18 to the exposure control apparatus 17 through the signal line 23 so as to modify the writing exposure reference plane.

Then, the computer 12 supplies the pattern data of the first field of a chip of a desired block through the switch 15 to the high speed memory 13. At the same time, the computer 12 modifies the center position of a field to be exposed on the basis of the result of the mark position detection and supplies the modified data of the center position of the field through the signal line 22 to the exposure control apparatus 17, so that the sample holder of the exposure apparatus 18 is moved to a predetermined position. When writing into the high-speed memory 13 has been completed, the computer 12 supplies control signals through the signal lines 26 and 27 to the switches 15 and 16, changing them to the other contact positions opposite to the illustrated ones, respectively. Thus, the data in the high-speed memory 13 is supplied through the signal line 21 to the exposure control apparatus 17. This apparatus 17 controls the deflection coil current of the exposure apparatus 18 in accordance with the pattern data, thus performing the pattern writing exposure by electron beam scanning. Subsequently, the computer 12 supplies to the exposure control apparatus 17 the modified data of the center position of the same field of the next chip within the block, and there the same process is performed. During this process, the computer 12 sends the pattern data of the next field through the switch 15 to the high-speed memory 14.

In this way, when the exposure of a predetermined field of each of all the chips within a block has been completed, the computer 12 supplies data of the center position of the next field and causes the switches 15 and 16 to change to the illustrated contact positions, respectively, thereby permitting the data in the high-speed memory 14 to be supplied to the exposure control apparatus 17.

When this operation is repeated to complete the exposure of one block, the same operation as described above is performed for the next block.

In this exposure of pattern, only two high-speed memories are provided in each of which pattern data of one field is stored as shown in FIG. 5. In the conventional way of completing the exposure of each chip, however, a high-speed memory of 9-field capacity is necessary when considering that one chip is formed of 9 fields. Therefore, the method of this invention needs only about 2/9 to ⅓ of the memory capacity in the conventional one.

The exposure control apparatus 17 serves to convert the digital data from the computer 12 to a sample holder driving voltage, an electron beam focus correcting coil current, an electron beam deflection coil current and so on, and it is apparent that the apparatus 17 itself can easily be produced by a well known technique.

While in the above embodiment the wafer is divided into 9 blocks each of which is formed of 9 or 12 chips each having 9 exposure fields, these numbers may be arbitrary.

Moreover, while a mark is provided at the four corners of each block, the number of marks may be arbitrary and the position of mark is not limited to the periphery of the block.

According to this invention as described above, the mark detection and pattern writing exposure are performed for each block, thereby remarkable reducing the writing exposure time with high accuracy.

In addition, according to the embodiment of the invention, the same fields of chips within each block are exposed in sequence and therefore the memory capacity to be used can be reduced to a great extent, and also the exposure reference plane is modified at each block unit, thereby the exposure accuracy is improved greatly.

We claim:

1. An exposure method with an electron beam exposure apparatus comprising steps of:
   dividing in advance a substrate having thereon a number of chips into blocks each having a plurality of chips;
   providing marks on each of said blocks but not on each of said chips;
   detecting the positions of the marks provided on said blocks upon exposing a desired block; and
   correcting writing exposure positions of the plurality of chips within each of said blocks on the basis of the detection results so that correction for said plurality of chips can be accomplished without having to provide marks for each of said chips.

2. An exposure method according to claim 1, wherein said marks are provided on the four corners of each block.

3. An exposure method according to claim 1 or 2, wherein each of said blocks has its sides of no greater than 20 mm each.

4. An exposure method according to claim 1 or 2, wherein each of said chips is divided into a plurality of fields, and further wherein the corresponding fields of all the chips within a desired one of said blocks are all exposed in sequence before exposure of the next corresponding fields of all of the chips is begun.

5. An exposure method according to claim 1 or 2, further comprising steps of detecting in advance the height of each mark put on a desired one of said blocks, and modifying a writing exposure reference plane of said block in accordance with the detection results.

6. An exposure method according to claim 3, wherein each of said chips is divided into a plurality of fields, and further wherein the corresponding fields of all the chips within a desired one of said blocks are all exposed in sequence before exposure of the next corresponding fields of all of the chips is begun.

7. An exposure method according to claim 3, further comprising steps of detecting in advance the height of each mark put on a desired one of said blocks, and modifying a writing exposure reference plane of said block in accordance with the detection results.

8. An exposure method according to claim 1, wherein said marks are provided only along an outer periphery of each of said blocks.

9. An exposure method according to claim 8, wherein at least some of said marks are provided at one or more corners of each of said blocks.

10. An exposure method according to claim 1, 2, 8 or 9, wherein the number of marks for each block is less than the number of said chips in each respective block.

11. An exposure method according to claim 1 or 2, wherein each block comprises nine chips.

12. An exposure method according to claim 1 or 2, wherein each block comprises sixteen chips.

13. An exposure method with an electron beam exposure apparatus comprising steps of:
   dividing in advance a substrate having thereon a number of chips into blocks having a plurality of chips;
   providing marks on each of said blocks;
   detecting the positions of the marks provided on said blocks upon exposing a desired block; and
   correcting writing exposure positions of the plurality of chips within each of said blocks on the basis of the detection results,
   wherein each of said chips is divided into a plurality of fields, and further wherein the corresponding fields of all the chips within a desired one of said blocks are all exposed in sequence before exposure of the next corresponding fields of all of the chips is begun.

* * * * *